US006747471B1

(12) United States Patent
Chen et al.

(10) Patent No.: US 6,747,471 B1
(45) Date of Patent: Jun. 8, 2004

(54) METHOD AND APPARATUS TO ESTIMATE BURN-IN TIME BY MEASUREMENT OF SCRIBE-LINE DEVICES, WITH STACKING DEVICES, AND WITH COMMON PADS

(75) Inventors: Kuo-Tso Chen, Hsinchu (TW); Chi-Ming Liu, Taoyuan (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 198 days.

(21) Appl. No.: 10/043,864

(22) Filed: Jan. 10, 2002

(51) Int. Cl.[7] .............................................. G01R 31/26
(52) U.S. Cl. ....................................... 324/765; 324/760
(58) Field of Search ............................. 324/765, 760, 324/763, 158.1; 438/17, 18

(56) References Cited

U.S. PATENT DOCUMENTS

| | | | |
|---|---|---|---|
| 5,057,441 A | 10/1991 | Gutt et al. ................... 437/8 |
| 5,619,437 A | 4/1997 | Nagai .................... 364/715.09 |
| 5,808,947 A | 9/1998 | McClure ................... 365/201 |
| 5,818,895 A | 10/1998 | Oh .......................... 337/118 |
| 5,835,552 A | 11/1998 | Kusumoto et al. ........... 377/24 |
| 5,946,248 A | 8/1999 | Chien et al. ............... 365/201 |
| 5,981,971 A | 11/1999 | Miyakawa .................. 257/48 |
| 5,994,915 A | * 11/1999 | Farnworth et al. .......... 324/765 |
| 5,995,428 A | 11/1999 | Chien et al. ............... 365/201 |
| 6,064,213 A | 5/2000 | Khandros et al. ........... 324/754 |
| 6,157,046 A | 12/2000 | Corbett et al. ............. 257/48 |
| 6,233,184 B1 | 5/2001 | Barth et al. ............... 365/201 |
| 6,246,075 B1 | 6/2001 | Su et al. .................. 257/48 |
| 6,326,800 B1 | * 12/2001 | Kirihata .................... 324/760 |
| 6,377,897 B1 | * 4/2002 | Boyington et al. ........... 702/81 |

OTHER PUBLICATIONS

Hodges et al., "Analysis and Design of Digital Integrated Circuits", Second Edition, David A. Hodges & Horace G. Jackson, McGraw–Hill, New York, Chinese Edition, c. 1983, pp. 371–375.

* cited by examiner

*Primary Examiner*—Kamand Cuneo
*Assistant Examiner*—Tung X. Nguyen
(74) *Attorney, Agent, or Firm*—George O. Saile; Stephen B. Ackerman; Billy Knowles

(57) ABSTRACT

A method and apparatus for estimating burn-in time for integrated circuit die on a wafer employs a reliability testing structure placed in a scribe line area of a wafer to permit improved estimation of burn-in time for integrated circuit on a wafer. Each reliability testing structure has a plurality of evaluation device structures formed on the substrate. Groups of the evaluation device structures are stacked on the surface of the substrate. The device structures are created to permit evaluation of one of a plurality of failure mechanisms of the integrated circuit. A forcing input pad and a sensing output pad are connected through a selection circuit to at least one of the evaluation devices. The selection circuit selects which of the evaluation devices are to receive a stimulus and to transmit a response. The stimulus is activated and the substrate is then stressed. Each selected evaluation device structure is examined for failure and the hazard rate for each failure mechanism of the integrated circuit is determined and from the hazard rate the burn-in time for the integrated circuit is calculated.

32 Claims, 10 Drawing Sheets

METHOD AND APPARATUS TO ESTIMATE BURN-IN TIME BY MEASUREMENT OF SCRIBE-LINE DEVICES, WITH STACKING DEVICES, AND WITH COMMON PADS

BACKGROUND OF THE INVENTION

1. Field of the Invention

This invention generally relates methods and structures for evaluating and assuring reliability of electronic components. More particularly this invention relates to testing methods and structures to evaluate and minimize burn-in testing of semiconductor wafers onto which integrated circuits are formed.

2. Description of Related Art

As integrated circuit densities and circuit performance has increased, the equipment necessary to evaluate and assure the reliability and functionality of the integrated circuits has become more complex and consequently more expensive. It is well known in the art and shown in FIG. 1 that the hazard rate or probability of failure of integrated circuits follows the commonly referred to "bathtub" curve 10. During evaluation of product requirements, the target hazard rate 5 of the integrated circuit is established. Whenever the hazard rate 10 of the integrated circuit exceeds the target hazard rate 5, the integrated circuit is not deemed sufficiently reliable for its intended application. The failures that occur in the early life period 15 of operation of the integrated circuit are referred to as infant mortality.

To predict the actual hazard rate 10 of the integrated circuits, wafer level reliability experiments are performed to detect the failure mechanisms and their impact on the actual hazard rate 10. The predicted hazard rate 20 does not detect lot-to-lot variations that impact the hazard rate 10 nor does it detect and unique variations 25 in the actual hazard rate 10. The reliability experiments facilitate determination of a burn-in schedule that is to eliminate the infant mortality failures from the integrated circuits. However, the lot-to-lot variations may mean that the burn-in schedule may significantly shorten the useful duration 30 of the integrated circuits and in the extreme, cause the integrated circuit to enter the wear-out period 35 earlier than expected.

The reliability evaluation testing and the burn-in testing utilize unique integrated circuit structures to evaluate the results of stress upon the integrated circuit that can cause failure. Typically the structures include, capacitor dielectric film evaluation devices, gate oxide integrity devices, polycrystalline silicon heating devices, contact metallurgy evaluation chains, interlayer via chains, MOS evaluation devices, plasma etching antenna effect patterns, metal electromigration structures, memory cell array, and specially designed circuit block structures. These structures examine the susceptibility of the integrated circuit failures due to such failure mechanisms as pin holes in insulating material such as gate oxides and other inter-level insulating materials, corrosion of metal layers in the presence of moisture, electromigration of the metal layers, etc.

During the technology reliability evaluation the test structures are formed as test sites on an integrated circuit die. An integrated circuit die typically contains one unique test structure to allow creation of a sufficiently large sample size to detect long term or low-level failure phenomena. However, during wafer-level test, the actual functional integrated circuits occupy, as shown in FIG. 2, the die 50 and any test structures or test sites are placed in the kerf or scribe lines 55 area between each integrated circuit die 50. Since the scribe line area 55 is relatively small, the test structure must occupy a relatively small area. This forces a relatively small sample size for evaluation of particular failure mechanisms that have low defect density. Thus, this small sample size does not allow sufficient sensitivity to indicate the defect density prior to burn-in. This forces the burn-in to be longer than necessary to assure that the infant mortality failures are screened from the production lot. For instance, evaluation of the characteristics of individual MOS transistors requires four bonding pads for each device. The bonding pads are relatively large and consume significantly more area than the MOS transistors. Therefore placing test structures for the individual transistors in the scribe lines 55 limits the number of transistors available for evaluation.

U.S. Pat. No. 6,157,046 (Corbett et al.) describes a semiconductor test chip. The semiconductor test chip includes structures for evaluating bond pad design effects and damage (cratering) effects, scribe lane width effects, thermal impedance effects of the die, ion mobility evaluation capabilities, and flip chip on board application test capabilities.

U.S. Pat. No. 6,064,213 (Khandros et al.) describes a wafer-level burn-in and test system that allows a wafer containing integrated circuits to be stressed and evaluated to conduct burn-in of the wafer to assure correct functioning of the wafer.

U.S. Pat. No. 6,246,075 (Su et al.) describes an ensemble of test structures for monitoring gate oxide defect densities and plasma antenna effects. The structures maybe included as a test site on a wafer containing integrated circuits or as test structures for reliability evaluation of an integrated circuit process.

U.S. Pat. No. 5,981,971 (Miyakawa) describes a semiconductor ROM wafer test structure, and IC card. The circuit structure such as the ROM is tested via a test pad formed on a scribe line. Since the test pad is formed on the scribe line, when the die containing the ROM has been cut off and separated from other chips along the scribe lines, the test pads are destroyed preventing future testing of the ROM.

U.S. Pat. No. 5,946,248 (Chien et al.) and U.S. Pat. No. 5,995,428 (Chien et al.) describe methods where a wafer containing memory devices, such as a DRAM (dynamic random access memory) are subjected to a burn-in operation of the memory device. As described in Miyakawa, pads are formed in the scribe lines. These pads are used to transfer an externally generated burn-in enable signal and a DC bias voltage to each memory device. Since the pads for burn-in wiring are formed in the scribe lines, they will not take additional space on the die where each memory device is formed.

U.S. Pat. No. 5,057,441 (Gutt et al.) describes a method for reliability testing integrated circuit metal films using a noise measurement technique. In one embodiment, a film portion to be tested is incorporated in a Wheatstone bridge circuit within a test site. A relatively large direct current is passed through the film to stimulate $1/f^2$ noise. A relatively small alternating current is concurrently passed through the film. The bridge imbalance signal at the ac frequency is amplified and demodulated by a phase-locked amplifier, and is then frequency analyzed. The film is evaluated by comparing the resulting noise power spectrum with predetermined standards.

U.S. Pat. No. 5,808,947 (McClure) teaches an integrated circuit that includes both a wafer test-mode path that is operable to carry a wafer test-mode signal and a wafer power-supply path that is operable to carry a wafer power-supply signal. The integrated circuit includes functional circuitry that supports normal and wafer-test modes of operation and that is coupled to the wafer test-mode path before the die is detached from the wafer. The functional circuitry is tested for operation when placed in the wafer test mode and functions normally when removed from the wafer test mode. The circuitry for the wafer test-mode path and the wafer power-supply path are located in the scribe line region of the wafer.

U.S. Pat. No. 6,233,184 (Barth et al.) describes structures for wafer level test and burn-in. The structures include a state machine or programmable test engines located on the wafer in the area not including the functional circuitry. Each test engine requires fewer than ten connections and each test engine can be connected to multiple integrated circuit die. Thus, the number of pads of the wafer that must be connected for test is substantially reduced while a large degree of parallel testing is still provided. Connections to the wafer and between test engines and chips are provided along a membrane attached to the wafer. Membrane connectors can be formed or opened after the membrane is connected to the wafer so shorted chips can be disconnected.

SUMMARY OF THE INVENTION

An object of this invention is to provide a method for estimating burn-in time for integrated circuit die on a wafer.

Another object of this invention is to provide a reliability testing structure to permit improved estimation of burn-in time for integrated circuit on a wafer.

Further, another object of this invention is to provide a reliability test structure placed in a scribe line area of a wafer to permit improved estimation of burn-in time for integrated circuits on a wafer.

Still further, another object of this invention is to provide multiple evaluation test devices within a reliability testing structure to permit improved estimation of burn-in time for integrated circuits on a wafer.

To accomplish at least one of these objects and other objects, a method for estimating burn-in time for integrated circuits begins by providing a semiconductor substrate onto which a plurality of reliability testing structures are formed.

Each reliability testing structure has a plurality of evaluation device structures formed on the substrate. Groups of the evaluation device structures are stacked on the surface of the substrate. The device structures are created to permit evaluation of one of a plurality of failure mechanisms of the integrated circuit. The evaluation devices are such devices as capacitor dielectric film evaluation devices, gate oxide integrity devices, polycrystalline silicon heating devices, contact metallurgy evaluation chains, interlayer via chains, MOS evaluation devices, plasma etching antenna effect patterns, metal electromigration structures, memory cell array, and specially designed circuit block structures.

Each evaluation device structure is connected to a first forcing input pad and a first sensing output pad. The first forcing input pad provides a first forcing stimulus to at least one of the evaluation device structures to stress the evaluation device structure. The first sensing output pad is connected to sense a first response signal from at least one of the evaluation device structures.

A second forcing input pad and a second sensing output pad are connected through a selection circuit to at least one of the evaluation devices. The second forcing input pad provides a second forcing stimulus to at least one of the evaluation device structures to further stress the evaluation device structure. The second sensing pad senses a second response signal from the evaluation device structure.

The selection circuit is connected to select which of the evaluation devices are to receive the second stimulus and to transmit the second response. The selection circuit includes a plurality of transmission MOS devices. Each of the transmission MOS devices is connected between the first stimulus input pad and one of the evaluation device structures. A decoder circuit is in communication with a gate terminal of each of the plurality of transmission MOS devices to activate the selected transmission MOS devices to selectively connect at least one of the evaluation device structures to the first stimulus input pad. A counter circuit is in communication with the decoder circuit to create from an increment signal an address code indicating which of the evaluation device structures are to be selected. The increment signal is applied to the decoder through a function control input pad. The increment signal stimulates the counter to increment and, thus, modify the address code to select which of the evaluation device structures are selected.

The counter circuit has an adder circuit, which sums a present address code with the select signal to generate the next address code. The adder circuit communicates with a first transmission gate to selectively transmit the next address code to a first buffer, which receives and retains the next address code. The first buffer is connected to communicate with a second transmission gate, which selectively transmits the next address code from the first buffer to a second buffer, which receives, retains and then transfers the next address code to the decoder. The counter further has a clock modulator that receives the select signal and provides first and second select signals to selectively activate the first and second transmission gates to transfer the next address code to the first and second buffers.

A first delaying circuit is optionally placed between the adder circuit and the first transmission gate to adjust timing of the transmitting of the next address code from the adder circuit to the first transmission gate. A second delaying circuit is placed between the first transmission gate and the first buffer to adjust timing of the transmitting of the next address code from the first transmission gate to the first buffer. A third delaying circuit is placed between the first buffer and the second transmission gate to adjust timing of the transmitting of the next address code from the first buffer to the second transmission gate. And, a fourth delaying circuit is placed between the second transmission gate and the second buffer to adjust timing of the transmitting of the next address code from the second transmission to the second buffer.

The counter further has an initial value circuit that places an initial value at the input of the second transmission gate. This establishes an initial value for the next address code and therefore sets a beginning count for the counter.

The adder has a first summing circuit that is to receive and add the increment signal and a least significant bit of the present address code to form a least significant bit of the next address code. A first carry circuit is connected to receive the increment signal and the least significant bit of the present address code to determine a first carry bit from the sum of the increment signal and the least significant bit of the present address code. The adder has plurality of summing circuits, where each summing circuit is connected to receive and add one of plurality of bits of the present address code and a carry bit. The carry bit is determined from an adjacent less significant bit of the present address code to form one of a plurality of bits of the next address code. Each of a plurality carry circuits is connected to also receive one of the plurality of bits of the present address code and the carry bit determined from the adjacent less significant bit of the present address code to form one of a plurality of carry bits.

Each of the summing circuits is an exclusive-OR gate. The exclusive-OR gate has a MOS transistor of a first conductivity type and a MOS transistor of a second conductivity type. The gates of the MOS transistors are connected to a first input terminal and drains are connected to a second input terminal. First and second inverter circuits are connected such that an input of the first inverter circuit and the output of the second inverter circuit are connected to a source of the MOS transistor of the first conductivity type and an output of the first inverter circuit and the input of the second inverter circuit are connected to a source of the MOS transistor of the second conductivity type. The first and second inverter circuits are standard CMOS inverter circuits thus the exclusive-OR circuit is formed of six transistors. The output terminal of the exclusive-OR circuit is formed at the connection of the source of the MOS transistor of the first conductivity type, the output of the first inverter circuit, and the input of the first inverter circuit.

The carry circuit is an AND circuit having a first MOS transistor of the first conductivity type. The gate of the first MOS transistor of the first conductivity type is connected to a first input terminal, the source is connected to an output terminal, and the drain is connected to a voltage reference terminal. The AND circuit has second MOS transistor of the second conductivity type with a gate connected to a second input terminal, a source connected to the output terminal, and a drain connected to a voltage reference terminal. To complete the AND circuit, a first depletion MOS transistor of the second conductivity type has its gate and source connected to the output terminal and a drain connected to a voltage supply terminal.

The clock modulator circuit has a resistor capacitor network connected to receive the increment signal and to slow the transitions of the increment signal so as to adjust a time at which the increment signal is at an active voltage level. A first buffering circuit is connected to the resistor capacitor network to generate a first select signal from the increment signal with the slowed transitions and a second buffering circuit is connected to the resistor capacitor network to generate a second select signal from the increment signal with slowed transitions. The first and second select signals are generally out of phase from each other.

A resistor, a capacitor and a depletion MOS transistor of the first conductivity type form the initial value circuit. The resistor has a first terminal connected to a voltage supply terminal. The capacitor has a first terminal connected to the second terminal of the resistor and a second terminal connected to a voltage reference terminal. The gate of the second depletion MOS transistor of the first conductivity type is connected to the connection of the first terminal of the capacitor and the second terminal of the resistor. The source is connected to the voltage supply terminal and the drain is connected to an output of the first buffer.

The method continues by selecting which of the testing evaluation devices are to be tested and then activating the first and second stimuli. The substrate is then stressed and each selected evaluation device structure is examined for failure. The hazard rate for each failure mechanism of the integrated circuit is determined and from the hazard rate the burn-in time for the integrated circuit is calculated.

BRIEF DESCRIPTION OF THE DRAWINGS

FIG. 9b is a plot of the waveforms of the initial value circuit of FIG. 9a.

FIG. 10b is a plot of the waveforms of the clock modulator of FIG. 10a.

DETAILED DESCRIPTION OF THE INVENTION

Figure 1:
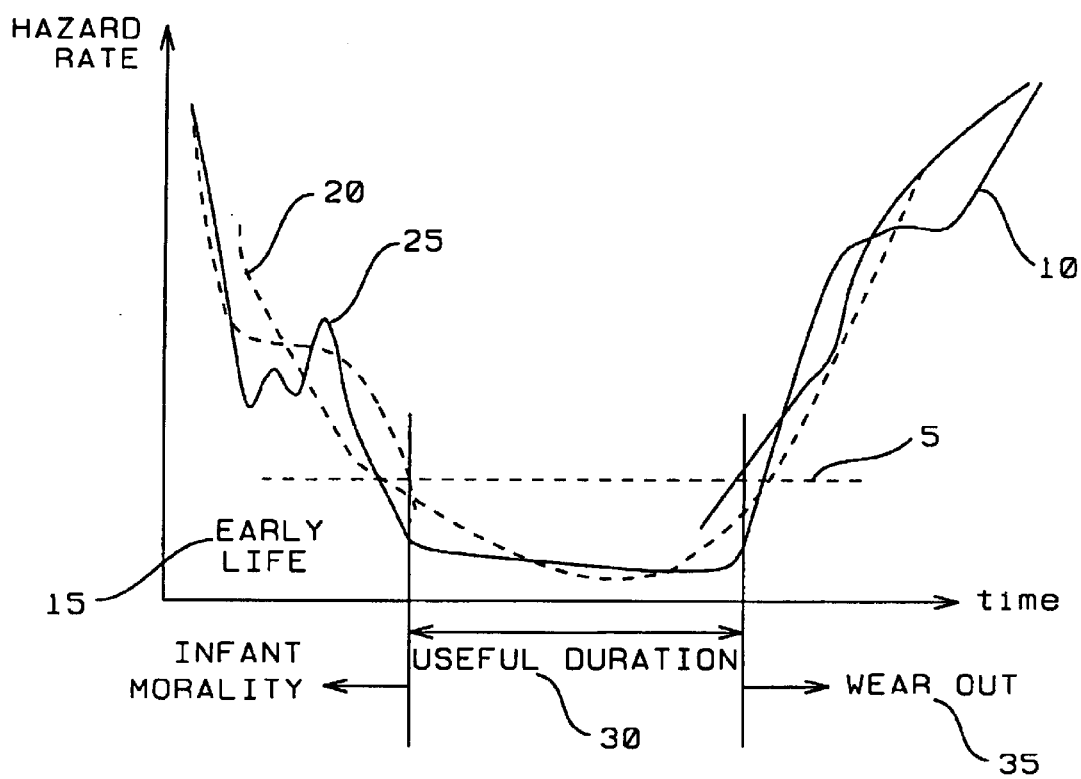
FIG. 1 is a plot of the hazard rate versus time of integrated circuits of the prior art.
Figure 2:
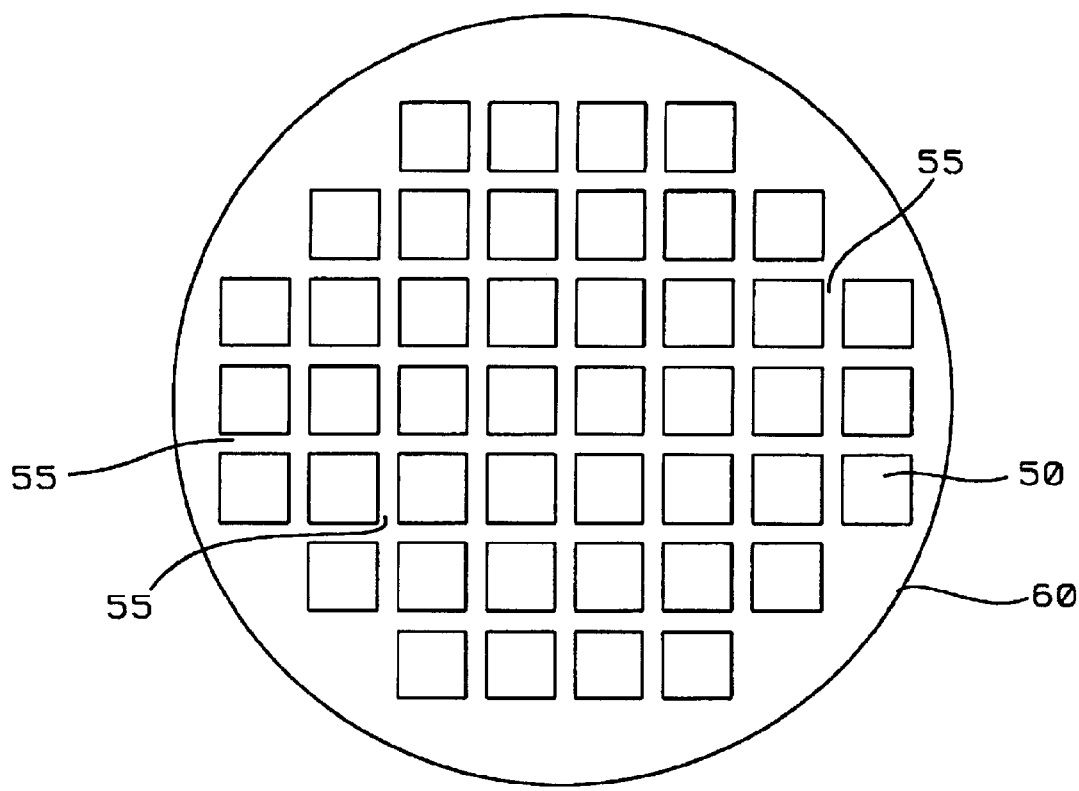
FIG. 2 is a diagram illustrating a semiconductor wafer highlighting integrated circuit die with kerf or scribe lines of the prior art.
Figure 3:
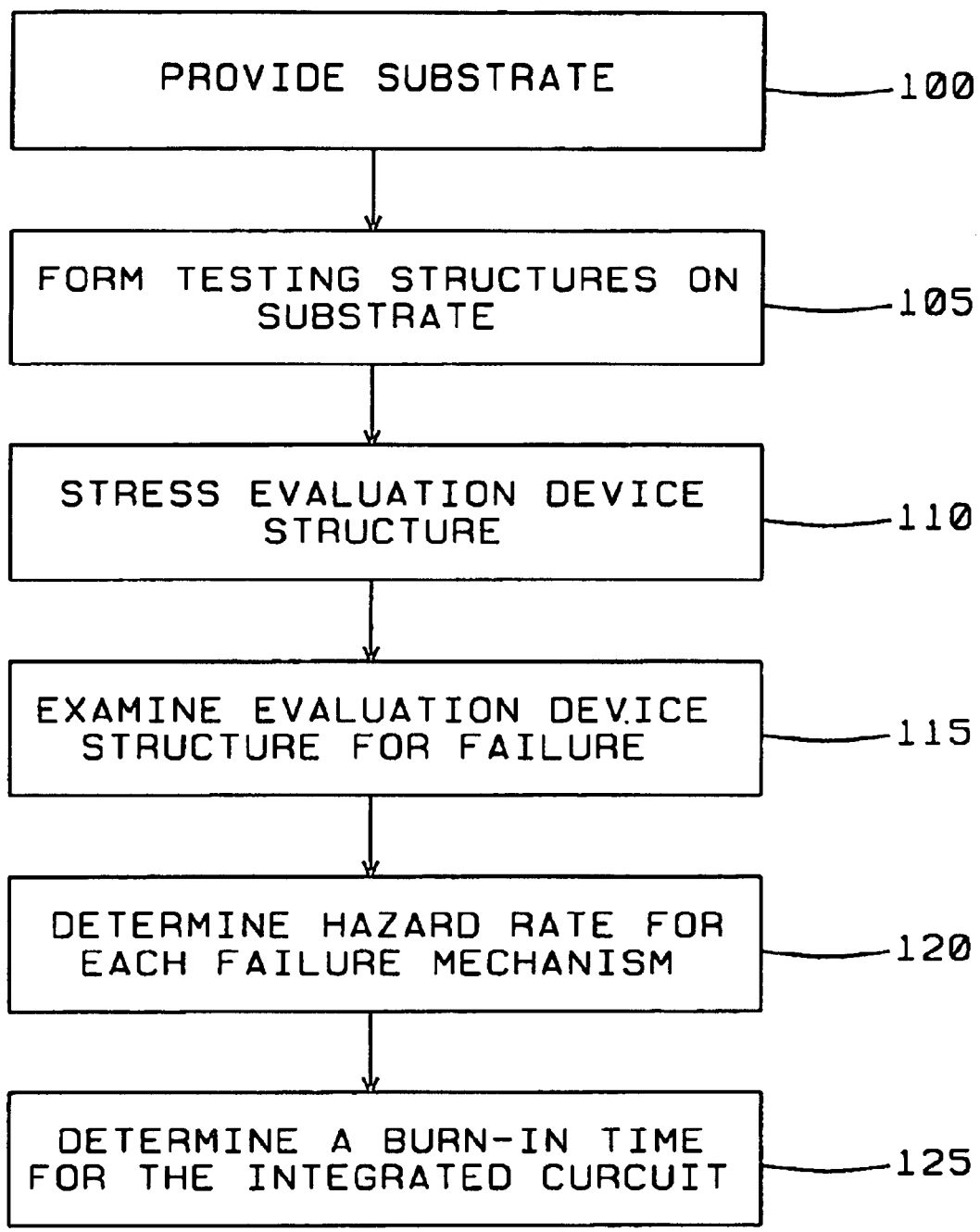
FIG. 3 is a flow diagram for estimating the burn-in time for a wafer containing integrated circuit die of this invention.
Figure 4:
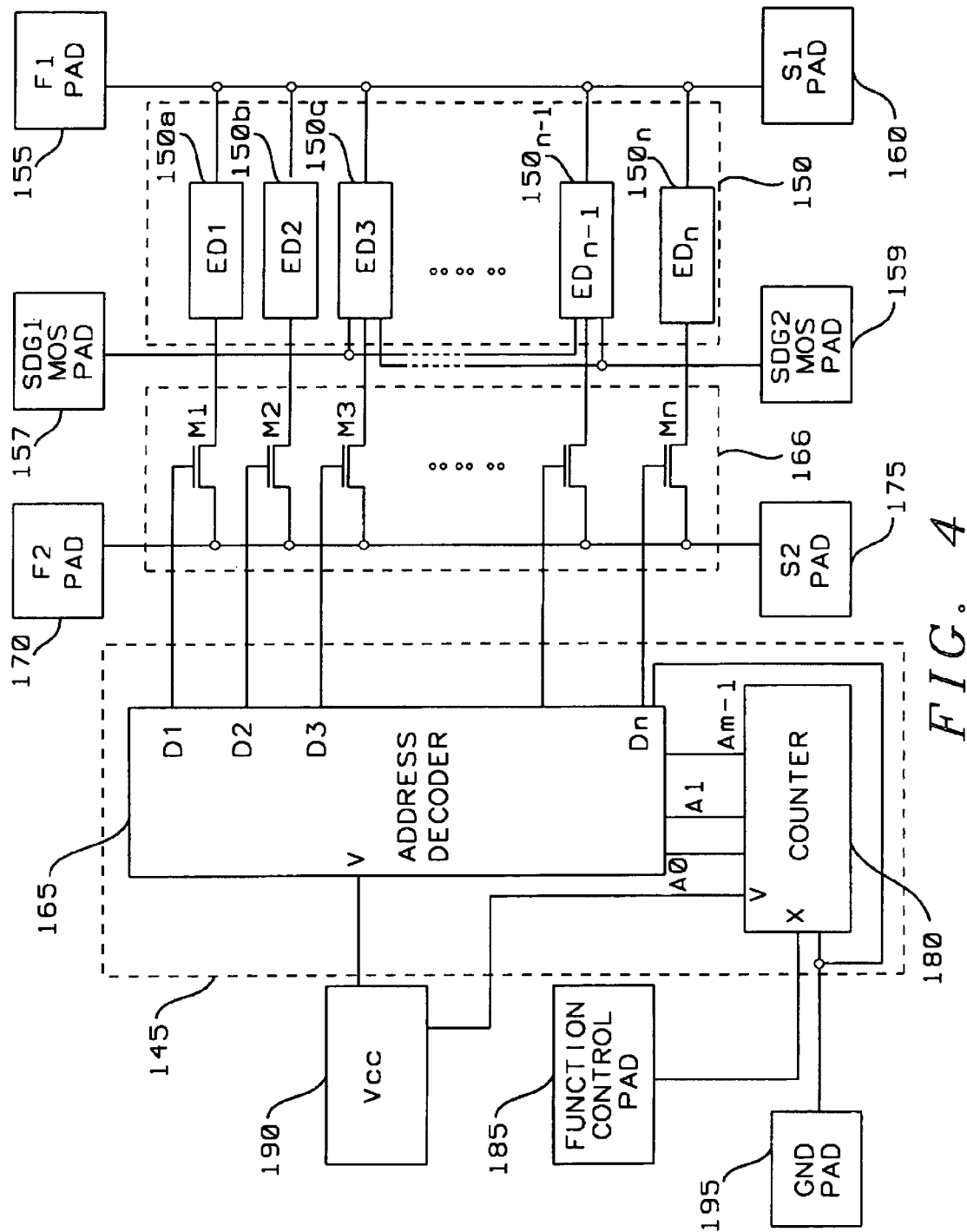
FIG. 4 is a schematic diagram of a reliability testing structure of this invention.
Figure 5:
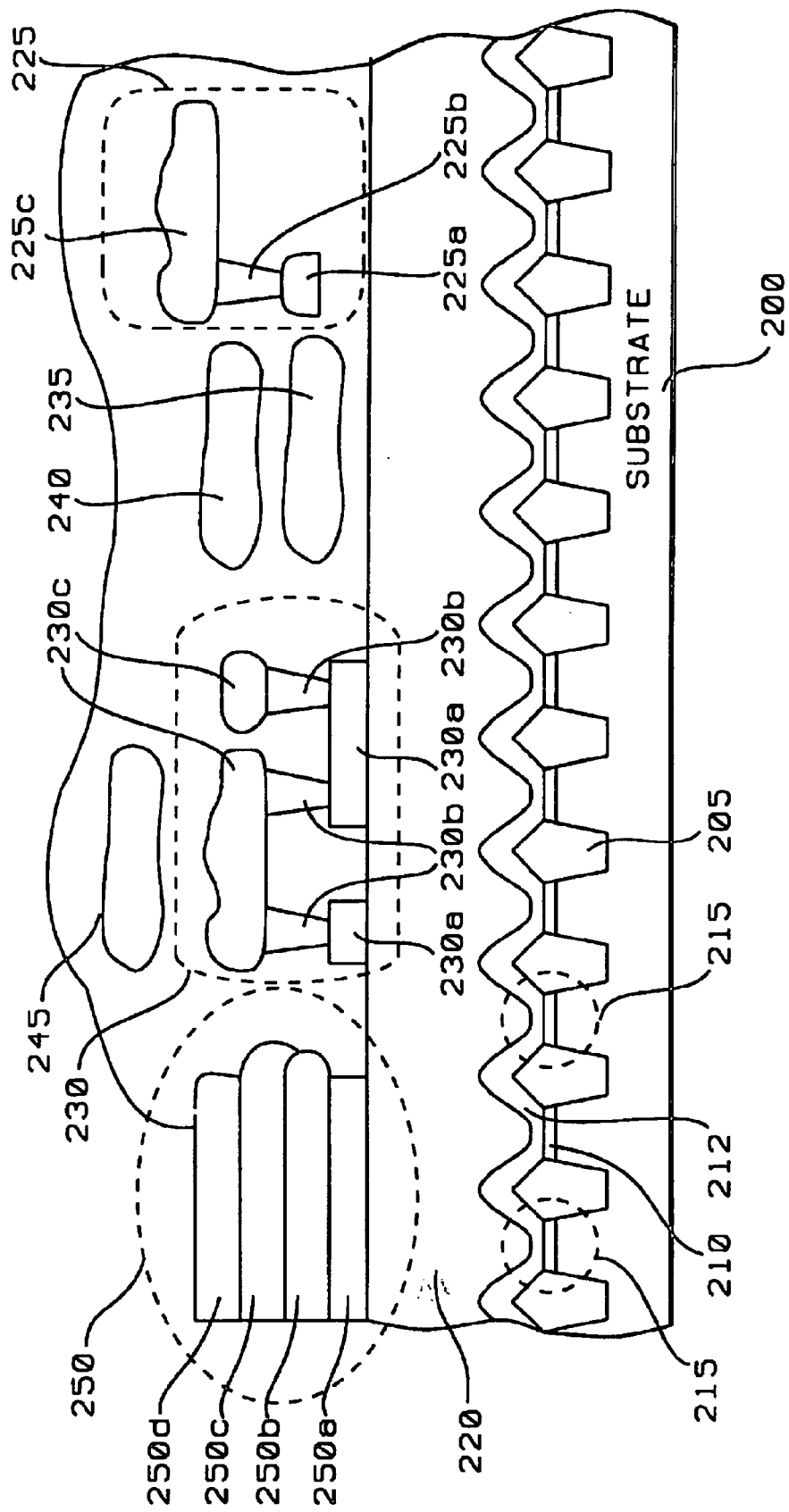
FIG. 5 is a cross-sectional view of a semiconductor wafer illustrating the stacking of evaluation device structures of this invention.

The method of this invention utilizes test structures having common Input/output pads to provide stimuli to and receive responses from selected evaluation device structures. The results of the results of stressing the evaluation device structures determine a hazard rate and from the hazard rate, a burn-in time is determined. Refer now to FIG. 3 for a detailed discussion of the method to determine burn-in of this invention. A semiconductor substrate 60 of FIG. 2 is provided (Box 100) with integrated circuit die formed on the substrate. Testing structures of this invention are formed (Box 105) in the kerf or scribe line area 55 of FIG. 2. Refer now to FIG. 4 for a description of the testing structures of this invention. Each testing structure has multiple evaluation devices 150 formed in the scribe line area of the semiconductor wafer. At least one of the multiple evaluation devices 150 is chosen by the selection circuit 145 to be stressed to determine the hazard rate or failure rate for a chosen failure mechanism. The evaluation devices 150 include such devices as ring oscillator circuits, capacitor dielectric film evaluation devices, gate oxide integrity devices, polycrystalline silicon heating devices, contact metallurgy evaluation chains, interlayer via chains, MOS evaluation devices, plasma etching antenna effect patterns, metal electromigration structures, and input/output pad structures. An exemplary formation of the evaluation devices is shown in FIG. 5. To form gate oxide integrity devices 215, a shallow trench isolation (STI) 205 is formed at the surface of the substrate 200. Between each of the shallow trench isolations 205, gate oxide regions 210 are placed on the surface of the substrate 200. A layer of polycrystalline silicon 212 is placed on the shallow trench isolations 205 and the gate oxide regions 210. Each gate oxide integrity device 215 is the laminations of the substrate 200, the gate oxide regions 210, and the polycrystalline silicon layer 212. The gate integrity devices 215 are evaluated by placing a relatively large voltage between the polycrystalline silicon layer 212 and the substrate 200.

Other devices are then stacked on the gate oxide integrity devices 215. For example, via chain device 225 is formed over the gate oxide integrity devices 215. The via chain device 225 is created by depositing a first level metal 225a on the oxide level 220. Multiple vias 225b are placed to contact the first level metal 225a and the second level metal 225c is placed to contact each of the multiple vias 225b. The connections are serially formed such that alternate pairs of the vias 225b are connected by either the first level metal 225a or the second level metal 225b so as form a sequential chain of vias 225b. A current is forced through the via chain device 225 and a voltage across the device is measured to determine any changes in resistivity of the vias 225c during a stress such as temperature.

Similarly metal migration devices 235, 240, and 245 are formed of the first level metal 235, the second level metal 240, and the third level metal 245 Again these metal migration devices are formed as part of the stack of evaluation devices to reduce the area consumed by the different evaluation devices. Additionally a contact chain device 230 is formed of a second level of polycrystalline silicon 230a, the vias 230b, and the second level metal 230c. The contact metal chain device 230 evaluates the effects of the alloying of the metal of the vias 230b into the polycrystalline silicon layers 230a. These devices are placed in a stack with the electromigration device 245 and the gate oxide integrity device 215.

Bonding pads 250 are formed on the gate oxide integrity devices 215. The bonding pads are formed by layering the second polycrystalline layer 250a, the first level metal 250a, the second level metal 250c, and the third level metal 250d. The bonding pads 250 maybe used to connect to the evaluation devices or maybe used to form the input/output pad evaluation devices.

Returning to FIG. 4, the first forcing pad 155 and the first sensing pad 160 are commonly connected to the evaluation devices 150. The first forcing pad 155 is connected externally to a device or tester to provide a stimulation signal to the selected evaluation device 150 and the sensing pad is connected to a device or tester receive a response signal from the selected evaluation test device 150. While the first forcing pad 155 and the first sensing pad 160 are shown connected together, the sensing pad 160 may be connected to other components of the selected evaluation device 150.

The second forcing pad 170 and the second sensing pad 175 are connected through the MOS transmission gates 166 to the evaluation devices 150. The second forcing pad 170 is externally connected to a device or tester to provide a second stimulus to a selected evaluation device 150 through at least one of the activated MOS transmission gates 166 and the second sensing pad receives a response from selected evaluation devices through the activated MOS transmission gates 166. As described for the first forcing pad 155 and the first sensing pad 160, the second forcing pad 170 and the second sensing pad 175 may be connected separately to the selected evaluation test devices 150. However, in this instance, if the second forcing pad 170 and the second sensing pad 175 are not commonly connected, as shown, additional MOS transmission gates must be provided.

The outputs D1, . . . , Dn of the address decoder 165 of the selection circuit 145 are connected to the gates of the MOS transmission gates 166 to select which of the MOS transmission gates 166 are to be connected to the second forcing pad 170 and the second sensing pad 175. In the preferred embodiment only one of the evaluation devices 150 is selected for any given evaluation. However, it is still in keeping with the intent of this invention that multiple evaluation devices 150 be selected simultaneously. The address inputs A0, . . . , Am-1 of the decoder 165 provide a binary code that is indicative of which of the MOS transmission gates 166 are activated to select the desired evaluation device 150.

Figure 6:
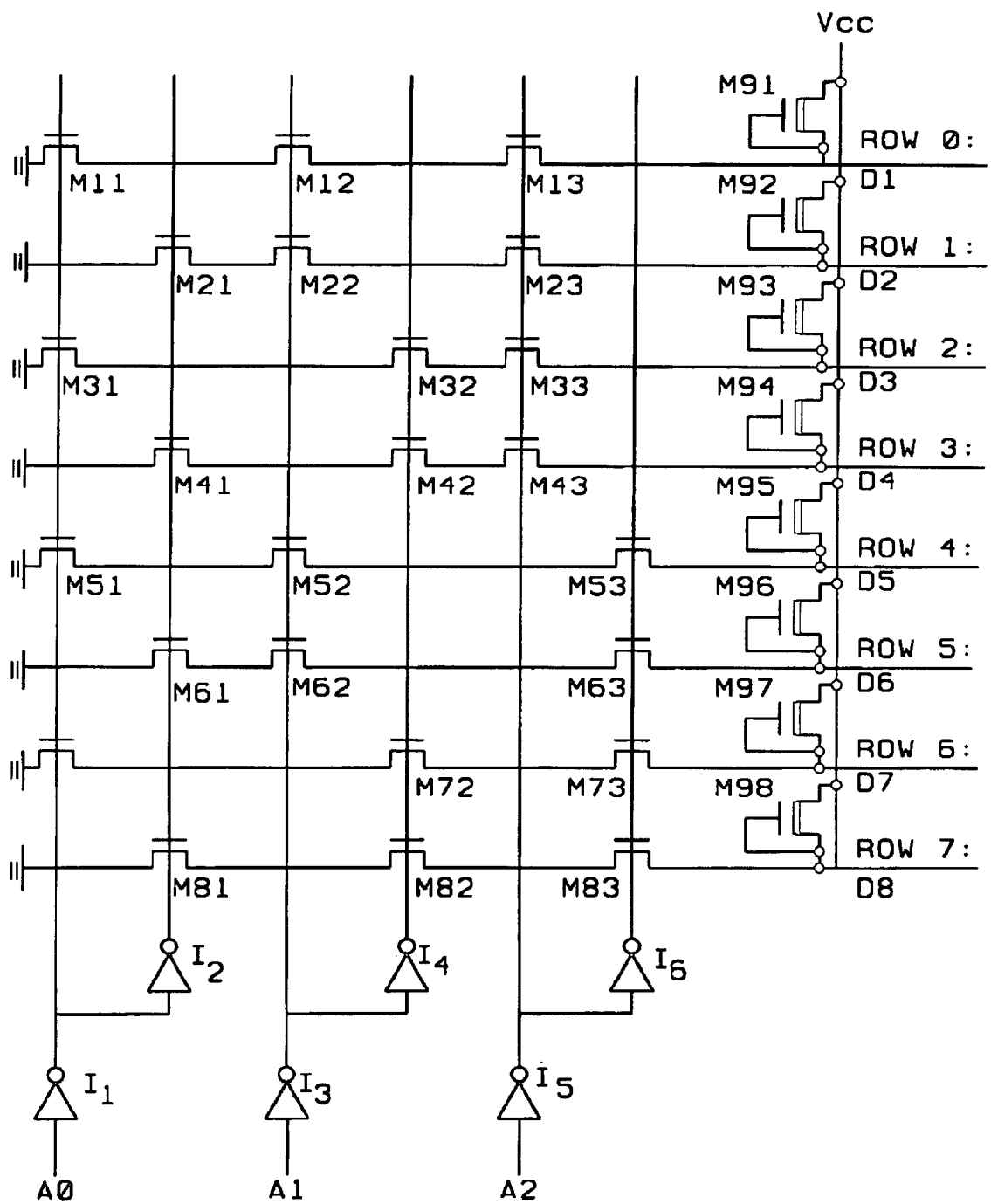
FIG. 6 is a schematic diagram of the address decoder of the reliability testing structure of this invention.

An example of an implementation of the address decoder 165 of the selection circuit 145 is described in *Analysis and Design of Digital Integrated Circuits*, second Edition, David A Hodges & Harace G. Jackson, McGraw-Hill, NewYork, Chinese Edition, 1988, pp. 421 and is shown in FIG. 6. The address inputs A0, A1, and A2 are connected to the inverters I1, I3, and I5. The outputs of the inverters I1, I3, and I5 are connected respectively to the inputs of the inverters I2, I4, and I6. The outputs of the inverters I1, I3, and I5 are the out-of-phase version of the address inputs A0, A1, and A2 and outputs of the inverters I2, I4, and I6 are the in-phase version of the address inputs A0, A1, and A2.

The MOS transistors M11, . . . , M83 are connected serially in sets of three. For instance the MOS transistors M11, M12, M13 are connected serially between the output terminal D1 and the voltage reference terminal. In this example, the gate of the MOS transistor M1 is connected to the inverter I2, the MOS transistor M12 is connected to the inverter I4, and the MOS transistor M13 is connected to the inverter I6. The depletion MOS transistor M91 is diode connected between the power supply voltage source and the output terminal D1. Thus when the input address A0, A1, and A2 are set to a first logic level (0), the MOS transistors M11, M12, M13 are deactivated (turned off) to set the output terminal D1 to the first logic level (1). This causes the MOS transistor M1 166a of FIG. 4 to be turned on to effectively connect the second forcing pad 170 and the second sensing pad 175 to the evaluation device 150a.

Figure 7:
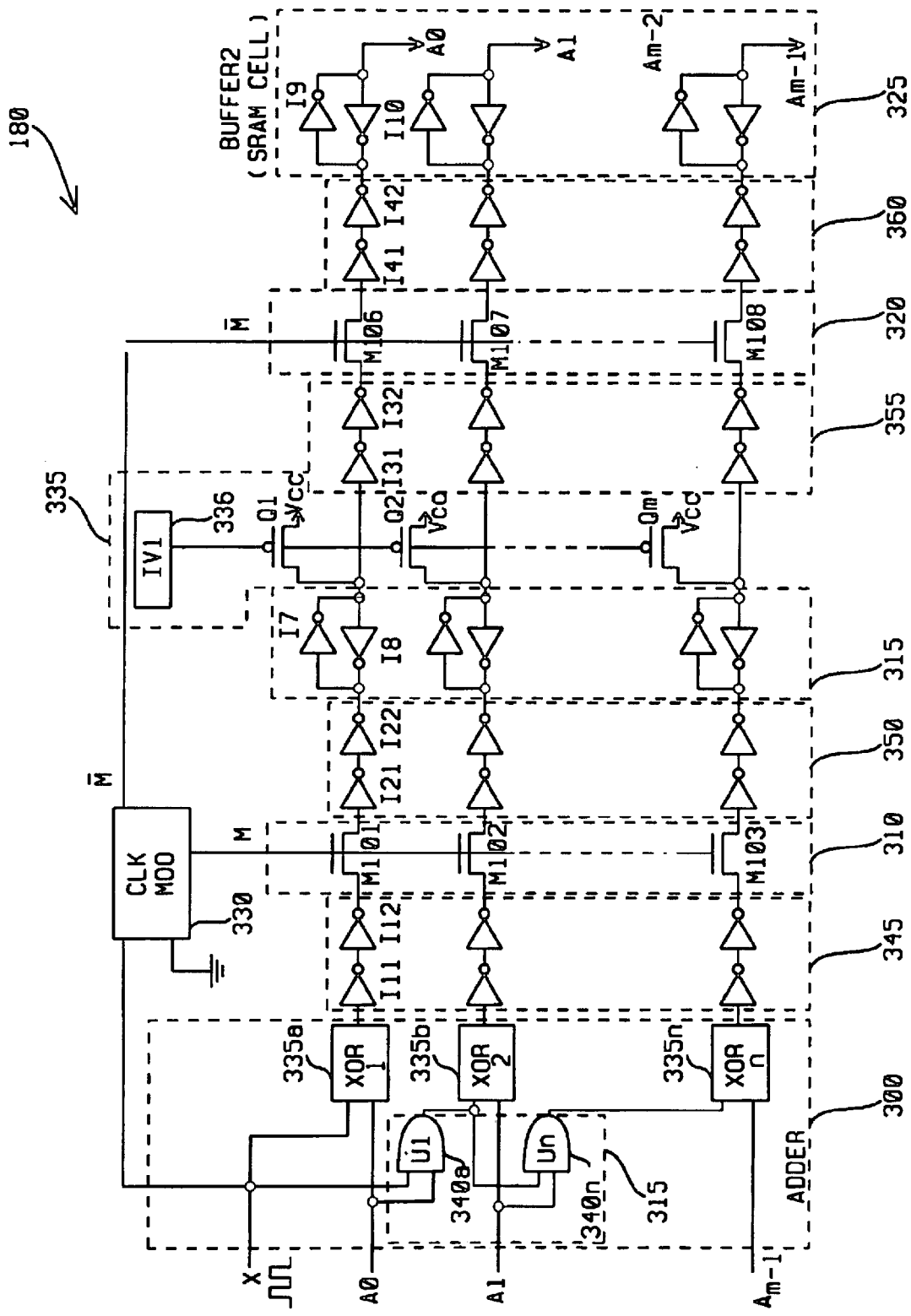
FIG. 7 is a schematic diagram of the counter of the reliability structure of this invention.

Each raw is constructed such that the MOS transistors M1, . . . , M83 are configured to be activated and deactivated to select the desired row D1, . . . , D8. While each address of this example shows selection of individual rows, D1, . . . ,D8, the circuit can be configured to activate multiple rows in any desired arrangement Returning to FIG. 4, the input address A, A1, . . . , Am-1 is generated by the counter 180 incorporated in the selection circuit 145. The control line X provides the increment signal for the counter 180. The control line X is connected to the function control pad 185 which is connected externally to a tester or device that will transmit the increment signal to cause the counter 185 to generate a binary count, which is then decoded by the address decoder 165 to activate one of the MOS transistors 166 to select the desired evaluation device 150. Refer now to FIG. 7 for a discussion of the structure of an embodiment of the counter 180 of the selection circuit in the testing structure of this invention. Fundamentally, the counter 180 functions by adding an incrementing bit X to the present input address value to form the next input address value A0, . . . , Am-1. To perform this function, the input address A0, . . . , Am-1 is connected from the second buffer 325 to the input of the adder circuit 300. The first summing circuit 335a of the adder circuit 300 has the least significant bit A0 of the present input address is summed with the increment signaling bit X to form the least significant bit of the next input address A0, . . . , Am-1. The first carry circuit 340a of the adder circuit combines the least significant bit A0 of the present input address with the increment signaling bit X to form the first carry bit. The remaining summing circuits 335b, . . . , 335n summed the carry bit from the lesser significant bit and the bit of the present input address A1, . . . , Am-1 to form the next input address. The remaining carry circuits. . . , 340n combine the carry bit from the lesser significant bit and the bit of the present input address A0, . . . , Am-1 to form the carry bit for the more significant bit computation.

Figure 8A:
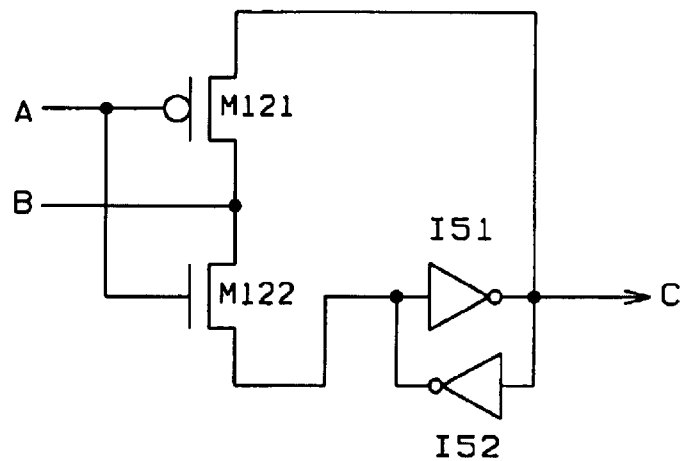
FIG. 8a, 8b, and 8c are schematic diagrams of the exclusive-OR circuit and the AND circuit of the counter of the reliability structure of this invention.
Figure 8B:
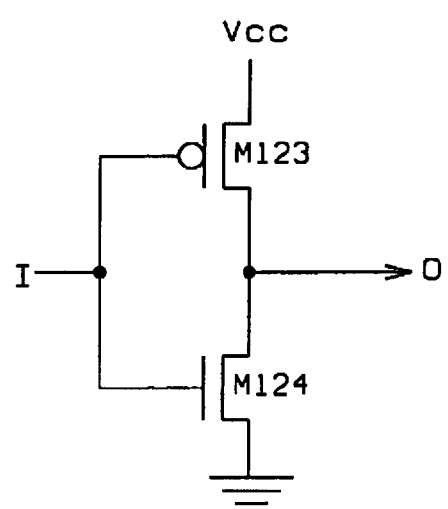

The summing circuits 305 are exclusive-OR circuits as shown in FIGS. 8a and 8b. The first input terminal A is connected to the gates of the P-type MOS transistor M121 and n-type MOS transistor M122 and the second input B is connected to the junction of the commonly connected drains of the MOS transistors M121 and 122. The source of the P-type MOS transistor M121 is connected to the output of the inverter I51 and the input of the inverter I52. The source of the type MOS transistor M122 is connected to the input of the inverter I51 and the output of the inverter I52.

The inverters I51 and I52 are as shown in FIG. 8b. The input of the inverter is connected to the gates of the P-type MOS transistor M123 and the N-type MOS transistor 124. The source of the P-type MOS transistor M123 is connected to the power supply voltage source Vcc and the source of the N-type MOS transistor M124 is connected to the power supply reference terminal. The output of the inverter is the junction of the connection of the drains of the MOS transistors M123 and M124. The output state of the inverter being of opposite phase as the input state of the inverter.

It is easily shown that when the inputs A and B are set to the same logic level (1 or 0) that the output C will assume the low logic level (0). Alternately, if the inputs A and B are not equal (A=0, B=1 or A=1, B=0), the output C is equal to the high logic level (1). This as is known in the art is the function of a summing circuit and an exclusive-OR.

Figure 8C:
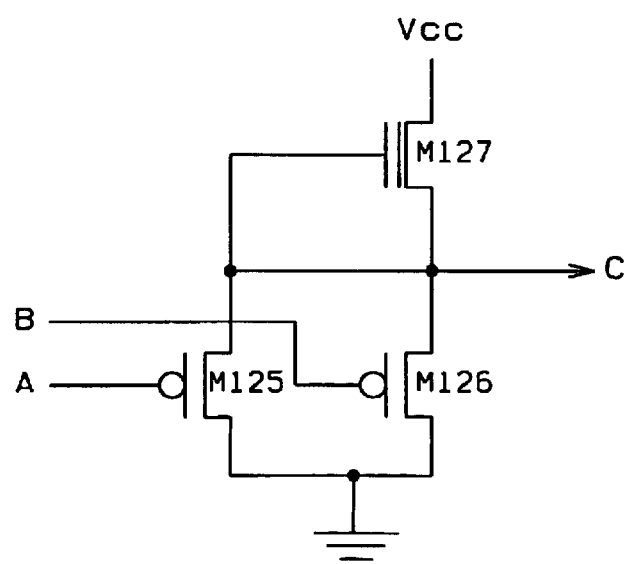

Returning to FIG. 7, the carry circuits 315 are AND circuits as shown in FIG. 8c. The gates of the P-type MOS transistors M125 and 126 are respectively connected to the input terminals A and B. The drains of the P-type MOS transistors M125 and 126 are connected to the power supply reference terminal and the sources are commonly connected to the output terminal C. The depletion MOS transistor M127 is diode connected between the power supply voltage source Vcc and the output terminal C. If the inputs A and B are both set to a high logic level (1), the output C has a value of the high logic level (1). The gate of the depletion MOS transistor M127 is connected to its own source and to the output terminal C. The drain of the depletion MOS transistor M127 is connected to the power supply voltage source Vcc. If either or both of the inputs A and B are set to the low logic level (0), the output C has a value of the low logic level (0). This is, as is known in the art, provides an AND circuit as well as a carry function.

The outputs A0', . . . , Am-1' of the adder circuit 300 are optionally inputs to delaying circuits 346. To assure the proper timing operation of the counter 180 the delaying circuits 345 provide timing delay to each of the delaying paths, if required. Each of the delaying circuits 345 is formed by serially connected inverters I11, . . . , I12. While the illustration shows a single pair of inverters I11 and I12, there may be any number of inverter I11 and I12 depending on the delay requirements of the counter 180.

The outputs of the optional delaying circuits 345 or the outputs A0', . . . , Am-1' of the adder circuit 300 are the inputs to the transmission gates 310. The transmission gates 310 control the transfer of the next input address signal from the outputs A0', . . . , Am-1' of the adder circuit 300 to the first buffer circuit 315. The control of the transfer of the next input address from the outputs A0', . . . , Am-1' of the adder circuit 300 to the first buffer circuit is provided by the dock modulator 330. The output M of the clock modulator 330 is connected to the gate terminal of each of the transmission gates 310.

To further control the timing of the transfer of the present address to the first buffer, a second set of delaying circuits 350 is optionally placed between the transmission gates 310. In a manner similar to the delaying circuits 345, each of the delaying circuits 350 is formed by serially connected inverters I121, . . . , I22. While the illustration shows a single pair of inverters I21 and I12, there may be any number of inverter I21 and I22 depending on the delay requirements of the counter 180.

The first buffer circuit 315 is an array of static random access memory (SRAM) cells. Each cell is formed of a pair of inverter circuits I7 and I8 having their outputs respectively connected to their inputs to form an elementary latching circuit. When the transmission gates 310 are activated, the first buffer circuit receives and retains the next input address. The output of the first buffer circuit 315 is optionally connected to the inputs to the third delaying circuits 355 or the second set of transmission gates 320.

The third delaying circuits 355 are optionally placed between the first buffer circuit and the second set of transmission gates 320 to provide any necessary delay to control the timing of the transfer of the present address from the first buffer circuit 315. The third delaying circuits 355 are formed of serially connected inverters 131 and 132, which are structured to provide a certain delay. Each delaying circuit 355 may have multiple inverters to establish the required delay to cause the performance of the counter 180 to meet it requirements.

The outputs of the delaying circuits 355 or the outputs of the first buffer circuit 315 are the inputs to the transmission gates 320. The outputs of the transmission gates 320 are either the inputs to the optional delaying circuit 360 or the second buffer circuit 325 Control signal $\overline{M}$ of the activation of the transmission gates 320 is provided to the gate terminal of each of the transmission gates 320 by the clock modulator 330.

The each of the optional fourth delaying circuits 360 is formed of serially connected inverters I41 and I42. As described for the other optional delaying circuits, the fourth delaying circuits delay the transfer of the present address to meet the counter timing requirements. The delay of the optional fourth delaying circuit is controlled by the structure of the inverters I41 and I42 and by having more than a single pair of the inverters I41 and I42 as illustrated.

The outputs of the optional fourth delaying circuits 360 or the transmission gates 320 are the inputs to the second buffer circuit 325. The outputs of the second buffer circuit are the terminal connection for the input address A0, . . . , Am-1 provided to the decoder circuit 165 of FIG. 4. The second buffer circuit is an SRAM array having SRAM cells formed by inverters I9 and I10. The inverters I9 and I10 have their respective inputs connected to their respective outputs to form an elementary latch circuit that retains the next input address A0, . . . , Am-1 at the input of the decoder circuit 165 of FIG. 4.

Figure 9A:
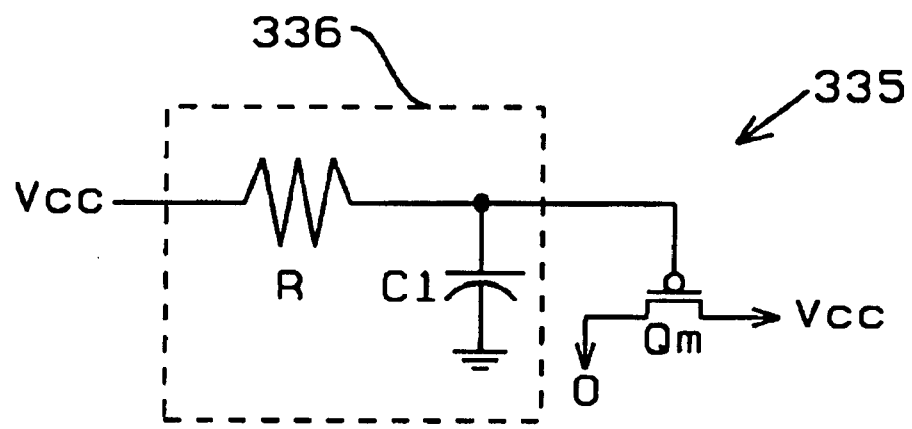
FIG. 9a is a schematic diagram of the initial value circuit of the counter of the reliability structure of this invention.
Figure 9B:
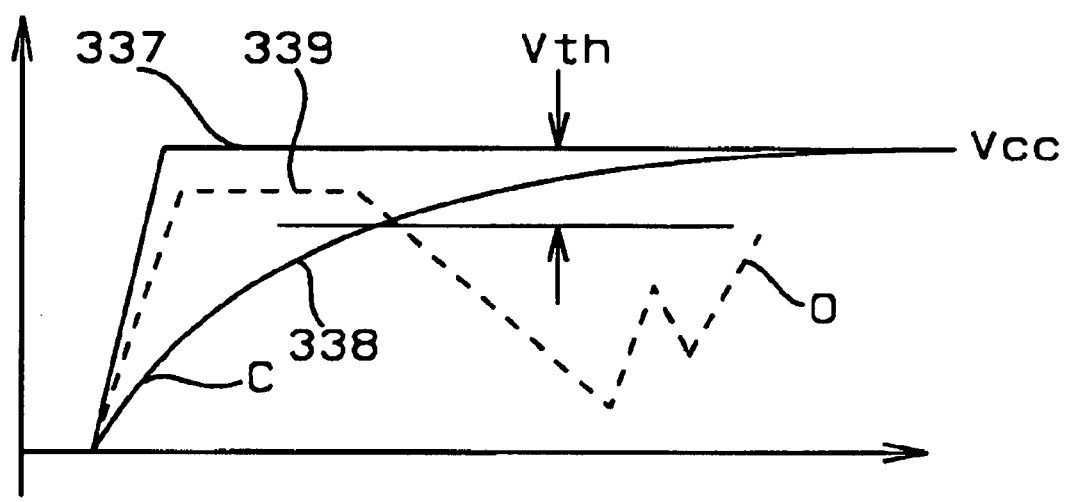

Since the operation of the counter 180 is based on the addition of the increment signaling bit X and the present input address A0, . . . , Am-1, The counter must have an initial value established to insure proper sequential operation. To place the counter 180 in an initial state, the initial value circuit 335 sets the output value of the first buffer circuit 315 to have an initial value (0000 . . . 00). The initial value circuit 335 consists of an initial value control circuit 338 and the P-type MOS transistors Q1, . . . , Qm. Refer to FIGS. 9a and 9b for a discussion of the structure and operation of the initial value function. The initial value control circuit 336 consists of a resistor R1 and a capacitor C1. The first terminal of the resistor R1 is connected to the power supply voltage source Vcc and the second terminal of the resistor R1 is connected to the first terminal of the capacitor C1. The second terminal of the capacitor C1 is connected to power supply reference terminal. The junction C of the connection of the second terminal of the resistor R1 and the first terminal of the capacitor C1 is connected to the gate of the P-type transistor Qm The source of the P-type MOS transistor Qm is connected to the power supply voltage source Vcc and the drain of the P-type MOS transistor Qm is connected to an output terminal 0 that is one of the outputs of the initial value circuit. The operation of the initial value circuit 335 is shown in the plot of FIG. 9b. When the power supply voltage source Vcc is activated, it rises quickly to it operational level 339. The resistor-capacitor network formed by the resistor R1 and the capacitor C1 causes the voltage at the junction terminal C rise slowly 338 according to the time constant of the resistor-capacitor network. While the difference in the voltage level of the power supply voltage source is greater than the threshold voltage level Vth of the P-type MOS transistor Qm, the MOS transistor Qm is turned on or conducting setting the voltage 339 at the drain of the P-type MOS transistor Qm to approximately the value of the power supply voltage source Vcc. When the difference of in the voltage level of the voltage at the junction terminal C and the power supply voltage source Vcc is less than the threshold voltage level Vth of the P-type MOS transistor Qm, the MOS transistor begins to turn off and the voltage at the drain of the MOS transistor Qm is no longer influenced by the initial value control circuit 336. This provides a high logic level (1) at the output of the first buffer 315 of FIG. 7, which is latched to the first buffer. This latched low logic level (0) is then latched to the set the output of the second buffer 325 of FIG. 7 to a low logic level (0). When the voltage level of the junction terminal C reaches the operating voltage level of the power supply voltage source Vcc, the P-type MOS transistor Qm turns off and the latched value of the first buffer 315 controls its output value.

Returning now to FIG. 7, when the increment signaling bit X is not active, the out-of-phase output $\overline{M}$ is at the high logic level (1), thus activating the transmission gates 320 to transfer the output of the first buffer 315 to the input of the second buffer 325. Thus the initial value circuit initializes the output of the counter 180 to be at a low logic level (0) and the first row of the decoder circuit 165 of FIG. 4 is selected.

Once the initial value for the counter is set, each activation of the increment signaling bit X causes the clock modulator to generate the transmission gate activation control signals M and $\overline{M}$. The in-phase activation control signal M activates the transmission gates 310 when the increment signaling bit X is active and the out-of-phase activation control signal $\overline{M}$ activates the transmission gates 320 when the increment signaling bit X is inactive. Thus the next count is transferred to the first buffer 315 when the increment signaling bit X is active and then it is transferred to the second buffer 325 when the increment signaling bit X is inactive. The clock modulator 330 controls the necessary timing to insure proper operation.

Figure 10A:
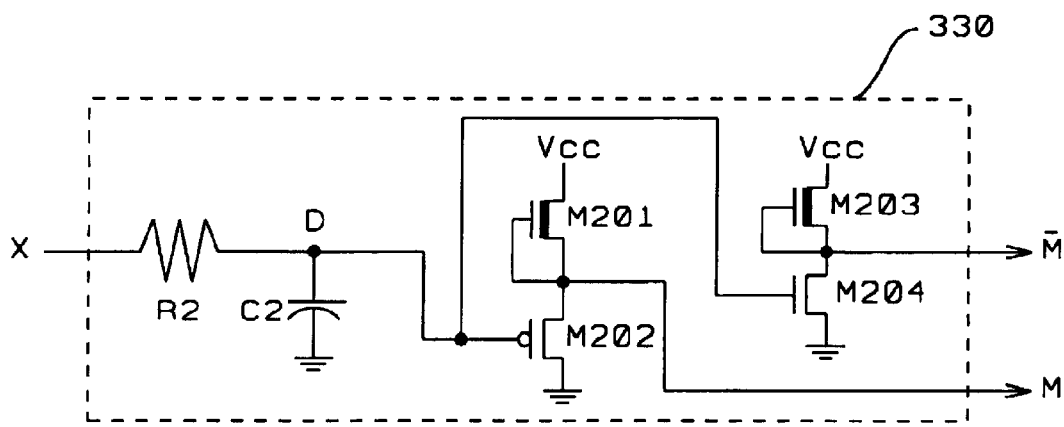
FIG. 10a is a schematic diagram of the clock modulator of the counter of the reliability structure of this invention.
Figure 10B:
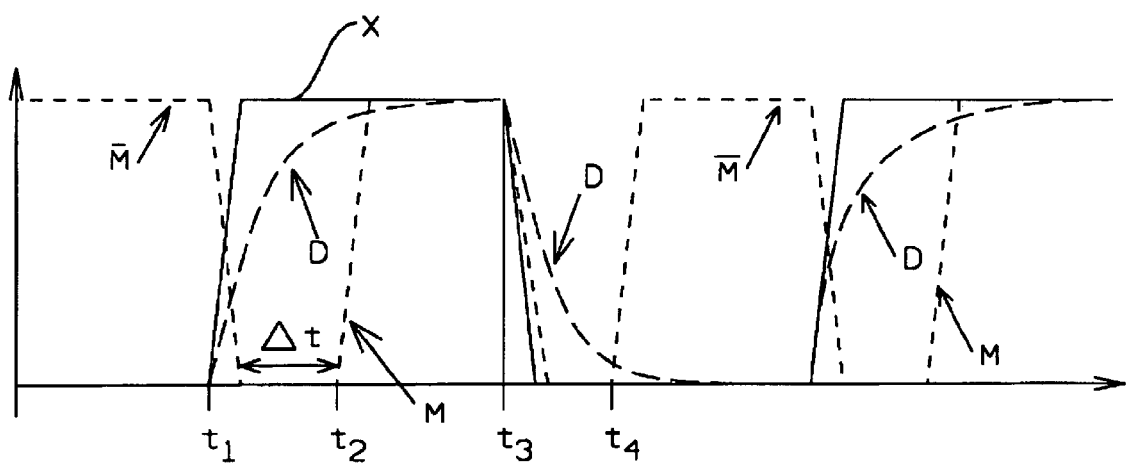

Refer now to FIGS. 10a and 10b for a discussion of the structure and function of the clock modulator 330. The clock modulator 330 has a resistor-capacitor network formed by the resistor R2 and the capacitor C2. The first terminal of the resistor R1 is connected to an input terminal to receive the increment signaling bit X. The second terminal of the resistor R2 is connected to the first terminal of the capacitor C2 that is designated the junction terminal D. The second terminal of the capacitor C2 is connected to the power supply reference terminal. The gates of the P-type MOS transistor M202 and the N-type MOS transistor M204 are connected to the junction terminal D. The source of the P-type MOS transistor M202 is connected the gate and source of the N-type depletion MOS transistor M201. The drain of the N-type MOS transistor M204 is connected the gate and source of the N-type depletion MOS transistor M203. The drains of the N-type depletion MOS transistors M201 and M203 are connected to the power supply voltage source Vcc. Further the N-type depletion MOS transistors M201 and M203 are diode connected to act as active loads for the MOS transistors M202 and M204. The drain of the P-type MOS transistor M202 and the source of the N-type MOS transistor M204 are connected to the power supply reference terminal. The source of the P-type MOS transistor M202 is the in-phase output terminal, which provides the transmission gate activation control signal M of the clock modulator 330 and the drain of the N-type MOS transistor M204 is the out-of-phase terminal, which provides the transmission gate activation control signal $\overline{M}$.

Now examining FIG. 10b, when the increment signaling bit X is inactive at a low logic level (0) (between the time $t_0$ and the time $t_1$), the in-phase transmission gate activation control signals M is at the low logic level preventing transfer of the new next input address A0', . . . , Am-1' from being applied to the first buffer 315 of FIG. 7. The out-of-phase transmission gate activation control signal $\overline{M}$ is at an high logic level (1) to pass the contents (the present input address) of the first buffer 315 to the second buffer 325 of FIG. 7. At the time $t_1$, the increment signaling bit X becomes active at a high logic level (1). The junction terminal D begins to increase in voltage as set by the time constant of the resistor-capacitor network (R2 and C2). When the difference of voltage at the junction terminal D and the power supply reference terminal voltage becomes greater than the threshold voltage Vth of the N-type MOS transistor M204, the MOS transistor M204 turns on and begins to conduct The voltage of the out-of-phase transmission gate activation control signal $\overline{M}$ reaches a low logic level (0). At a time $\Delta t$ after the out-of-phase transmission gate activation control signal $\overline{M}$ acheives the low logic level (0), the in-phase transmission gate activation control signal M rises to the high logic level (1) at the time $t_2$. At the time $t_1$, the adder circuit 300 of FIG. 7 generates the next input address A0, . . . , Am-1'. At the time $t_2$, the transmission gates 310 are activated to transfer the next input address A0', . . . Am-1' to the first buffer 315.

At the time $t_3$, the increment signaling bit X changes from the high logic level (1) to the low logic level. The voltage at the junction terminal D begins to decrease as dictated by the resistance-capacitance time constant of the resistor R2 and the capacitor C2. When the difference between the volttage level at junction terminal D and the power supply voltage source becomes greater than the voltage threshold Vth of the P-type MOS transistor M202, the in-phase transmission gate activation control signals M switches to the low logic level (0). Similarly, after the time delay caused by the resistance-capacitance time constant of the resistor R2 and the capacitor C2, the voltage at the junction terminal D becomes less than the threshold voltage Vth of the N-type MOS transistor M204 and the out-of-phase transmission gate activation control signal $\overline{M}$ switches to the high logic level (1). At the time just after the time $t_3$, when the in-phase transmission gate activation control signal M reaches the low logic level (0), the transmission gates 310 are deactivated to remove any communication of the next input address A0', ..., Am-1' from the first buffer 315 of FIG. 7. At the time $t_4$, when the out-of-phase transmission gate activation control signal $\overline{M}$ acheives the high logic level (1), the next address is transferred from the first buffer 315 to the second buffer 325. The next address is then retained to apply this address to the address decoder circuit 165 of FIG. 4 and to the input of the adder circuit 300 of FIG. 7, thus completing an increment cycle.

As is apparent, the timing of the in-phase transmission gate activation control signal M, the out-of-phase transmission gate activation control signal $\overline{M}$, and the amount of delay of the first, second, third and fourth delaying circuits 345, 350, and 355 insures the proper operation of the counter circuit 180. These timings prevent any false counts or extra counting and guarantee the proper input address being transferred to the address decoder 165 of FIG. 4

Returning now to FIG. 4, the power supply input terminal 190 is connected to an external power supply voltage source Vcc. The power supply reference terminal 195 is connected to the power supply reference or return terminal or ground. If any of the evaluaton devices 150 are in fact four terminal devices, such a MOS transistors, the pads 157 and 159 are connected to the devices to augment and control the device functioning. As an example, if the evaluation device 150c were a MOS transistor and the first forcing signal from the first forcing pad 155 and the second forcing signal from the second forcing pad 170 provided a voltage stress from the drain and source of the MOS transistor, then the gate and bulk of the MOS transistor would be connected respectively to the pads 157 and 159. From this illustration, it is shown that number of input/ouput pads required for the reliability evaluation is minimized, while permitting the selection of the the desired evaluation testing to generate the hazard rate of particular failure mechanisms.

Referring back now to FIG. 3 to continue discussion of the method for evaluation of the burn-in time of this invention, upon completion of the forming (Box 105) of the test structures as described in FIG. 4 on the substrate, the substrate is placed in a chamber and subjected to an environmental stress (Box 110) to accelerate any of the predicted failure mechanisms. At the completion of the stress (Box 110), the evaluation devices of the test structure are examined (Box 115) for failure. The types of failures are cataloged and a hazard rate for each failure mechanism is determined (Box 120). The burn-in time is calculated (Box 125) from the hazard rate.

The test structures of FIG. 4 are to be included in the manufacturing of integrated circuits on substrates. The substrates are subjected to environmental stress to eliminate the infant mortality of the product as described above. The test structures are examined to create a set of statistics showing the lot-to-lot variations in the failure mechanisms and the resulting changes in the hazard rates. The test structure of FIG. 4 allows data to be collected to improve the estimates of the hazard rate and thus allow an improvement of the types of stress and the time for stressing required for burn-in.

In summary, the test structure of this invention has evaluation devices are that are stacked as they are are formed on a semiconductor substrate. There are multiple stacked evaluation devices, any of which are chosen so as to provide evaluation of certain failure mechanisms and prevent confounding of the results from other failure mechanisms. The testing structure employs a minimal number of input/output pads to insure efficient use of space on the substrate. While this testing structure maybe used in evaluation test sites for initial evaluation of the hazard rates of a new technology, it is primarily intended to be placed in the scribe line or kerf area between the integrated circuit die on the substrate. This allows continued reliability evaluation during burn-in of the integrated circuits, while minimizing area of the substrate consumed by test devices.

The defect density found during wafer test of the test structure of this invention is used to estimate the duration of burn-in for the integrated circuits. The defect density of the test structure is indicative of failure mechanisms. Thus, by measuring the defect density (defects/cm$^2$) within the the testing structure of this invention during wafer testing, the burn-in duration is calculated according to the following equation:

$$f \cong D_o \frac{t}{50} e^{-(\frac{t}{10})^2} \text{ hrs}^{-1}$$

where:

f is the desired failure rate or hazard rate for a particular failure mechanism.

$D_o$ is the defect density found within the test structure of this invention during wafer testing.

t is the estimation of the duration of the burn-in of the integrated circuits.

The following example demonstrates the usage of the test structure of this invention to estimate a burn-in time for two different manufacturing lots of a wafer of an integrated circuit. In the first lot (A), there are 2 defects found in two hundred test structures present on the wafer. Each test structure has an area of approximatly 0.5 mm$^2$. The defect density for lot A is calculated according to the equation:

$$D_o \cong -\frac{\ln(yield)}{area} = -\frac{\ln\left(1 - \frac{2 - 0.3}{200 - 0.4}\right)}{9.5 \text{ mm}^2} = 1.7 \text{ cm}^{-2}$$

To maintain a hazard rate for the particular failure mechanism below $10^{-3}$ hrs$^{-1}$, the failure rate equation is solved to determine the burn-in time as approximately 26 hours.

In a second lot (B), the wafer testing has shown that there are two defects found in 2000 test structures. Given an identical test structure to test the failure mechanism as identified for lot A with an equal desired hazard rate, the new burn-in time for lot B is now calculated as above to be 20 hours. As can be seen from the above, lot B requires more testing at the wafer testing (2000 test structures versus 200 test structures), but allows a savings of six hours of burn-in testing (20 hours for lot B versus 26 hours for lot A). The burn-in testing of integrated circuits generally is more expensive and time consuming that the wafer testing to determine the defect density.

While this invention has been particularly shown and described with reference to the preferred embodiments thereof, it will be understood by those skilled in the art that various changes in form and details may be made without departing from the spirit and scope of the invention.

The invention claimed is:

1. A method for estimating burn-in time for integrated circuits comprising the steps of:
   providing a substrate;
   forming a plurality of testing structures on said substrate, each substrate being formed by the steps of:
      forming a plurality of evaluation device structures on said substrate, each device structure created to permit evaluation of failure mechanisms of said integrated circuit,
      forming a first forcing input pad to provide a first forcing stimulus to at least one of said evaluation device structures to provide a first stimulus to stress said evaluation device structure,
      forming a second forcing input pad to provide a second forcing stimulus to at least one of said evaluation device structures to further stress said evaluation device structure,
      forming a first sensing output pad connected to sense a first response from at least one of said evaluation device structures,
      forming a second sensing output pad connected to sense a second response from at least one of said evaluation device structures, and
      forming a selection circuit connected to selectively communicate the second stimulus to at least one selected evaluation device structure and the second response from the selected evaluation devices structure;
   activating said first and second stimuli;
   stressing said substrate;
   examining each selected evaluation device structure for failure;
   determining a hazard rate for each failure mechanism of said integrated circuit; and
   determining a burn-in time for said integrated circuit.

2. The method of claim 1 wherein the forming of the evaluation device structure further comprises the step of:
   stacking multiple evaluation device structures as they are formed at a top surface of said substrate.

3. The method of claim 1 wherein forming the selection circuit comprises the steps of:
   forming a plurality of transmission MOS devices, each transmission MOS device being connected between the first stimulus input pad and one of the evaluation device structures;
   forming a decoder circuit in communication with a gate terminal of each of the plurality of transmission MOS devices to activate selected transmission MOS devices to selectively connect at least one of the evaluation device structures to the first stimulus input pad; and
   forming a counter circuit in communication with the decoder circuit to provide an address code indicating which of the evaluation device structures are to be selected.

4. The method of claim 3 wherein the forming the selection further comprises the step of:
   forming a function control input pad to transfer an increment signal to the counter stimulating the counter to increment to modify the address code to select which of the evaluation device structures are selected.

5. The method of claim 1 wherein the evaluation device structures are selected from a group of evaluation device structures consisting of capacitor dielectric film evaluation devices, gate oxide integrity devices, polycrystalline silicon heating devices, contact metallurgy evaluation chains, interlayer via chains, MOS evaluation devices, plasma etching antenna effect patterns, metal electromigration structures, memory cell array, and specially designed circuit block structures.

6. The method of claim 1 wherein the evaluation device test structures are formed in a scribe line area between the integrated circuits on said substrate.

7. An apparatus for estimating burn-in tins for integrated circuits comprising:
   means for providing a substrate;
   means for forming a plurality of testing structures on said substrate, said means comprising:
      means for forming a plurality of evaluation device structures on said substrate, each device structure created to permit evaluation of failure mechanisms of said integrated circuit,
      means for forming a first forcing input pad to provide a first forcing stimulus to at least one of said evaluation device structures to provide a first stimulus to stress said evaluation device structure,
      means for forming a second forcing input pad to provide a second forcing stimulus to at least one of said evaluation device structures to provide a second stimulus to further stress said evaluation device structure,
      means for forming a first sensing output pad connected to sense first response from at least one of said evaluation device structures,
      means for forming a second sensing output pad connected to sense a second response from at least one of said evaluation device structures, and
      means for forming a selection circuit connected to selectively communicate the second stimulus to at least one selected evaluation device structure and the second response from the selected evaluation devices structure;
   means for activating said first and second stimuli;
   means for stressing said substrate;
   means for examining each selected evaluation device structure for failure;
   means for determining a hazard rate for each failure mechanism of said integrated circuit; and
   means for determining a burn-in time for said integrated circuit.

8. The apparatus of claim 7 wherein the means for forming of the evaluation device structure further comprises:
   means for stacking multiple evaluation device structures as they are formed at a top surface of said substrate.

9. The apparatus of claim 7 wherein means for forming the selection circuit comprises:
   means for forming a plurality of transmission MOS devices, each transmission MOS device being connected between the first stimulus input pad and one of the evaluation device structures;
   means for forming a decoder circuit in communication with a gate terminal of each of the plurality of transmission MOS devices to activate selected transmission MOS devices to selectively connect at least one of the evaluation device structures to the first stimulus input pad; and
   means for forming a counter circuit in communication with the decoder circuit to provide an address code indicating which of the evaluation device structures are to be selected.

10. The apparatus of claim 9 wherein the means for forming the selection further comprises:
  means for forming a function control input pad to transfer an increment signal to the counter stimulating the counter to increment to modify the address code to select which of the evaluation device structures are selected.

11. The apparatus of claim 7 wherein the evaluation device structures are selected from a group of evaluation device structures consisting of capacitor dielectric film evaluation devices, gate oxide integrity devices, polycrystalline silicon heating devices, contact metallurgy evaluation chains, interlayer via chains, MOS evaluation devices, plasma etching antenna effect patterns, metal electromigration structures, memory cell array, end specially designed circuit block structures.

12. The apparatus of claim 7 wherein the evaluation device test structures are formed in a scribe line area between the integrated circuits on said substrate.

13. A reliability testing structure formed on a substrate comprising:
  a plurality of evaluation device structures formed on said substrate, each device structure created to permit evaluation of one of a plurality of failure mechanisms of said integrated circuit;
  a first forcing input pad to provide a first forcing stimulus to at least one of said evaluation device structures to provide a first stimulus to stress said evaluation device structure;
  a second forcing input pad to provide a second forcing stimulus to at least one of said evaluation device structures to provide a second stimulus to further stress said evaluation device structure;
  a first sensing output pad connected to sense first response from at least one of said evaluation device structures;
  a second sensing output pad connected to sense a second response from at least one of said evaluation device structures; and
  a selection circuit connected to selectively communicate the second stimulus to at least one selected evaluation device structure end the second response from the selected evaluation device structure.

14. The reliability testing structure of claim 13 wherein multiple evaluation device structures are stacked as they are formed at a top surface of said substrate.

15. The reliability testing structure of claim 13 wherein the selection circuit comprises:
  a plurality of transmission MOS devices, each transmission MOS device being connected between the first stimulus input pad and one of the evaluation device structures;
  a decoder circuit in communication with a gate terminal of each of the plurality of transmission MOS devices to activate selected transmission MOS devices to selectively connect al least one of the evaluation device structures to the first stimulus input pad; and
  a counter circuit in communication with the decoder circuit to create from an increment signal, an address code indicating which of the evaluation device structures are to be selected.

16. The reliability testing structure of claim 15 wherein the selection circuit further comprises:
  a function control input pad to transfer the increment signal to the counter stimulating the counter to increment to modify the address code to select which of the evaluation device structures are selected.

17. The reliability testing structure of claim 15 wherein the counter circuit comprises;
  an adder circuit which sums a next address code with the increment signal to generate the next address code;
  a first transmission gate in communication with the adder circuit to selectively transmit the next address code;
  a first buffer in communication with the first transmission gate to receive and retain the next address code;
  a second transmission gate in communication with the first buffer to selectively transmit the next address code from the first buffer; and
  a second buffer in communication with the second transmission gate to receive, retain and then transfer to the decoder the next address code.

18. The reliability testing structure of claim 17 further comprising
  a clock modulator that receives the increment signal and provides first and second increment signals to selectively activate the first and second transmission gates to transfer the next address code to the first and second buffers.

19. The reliability testing structure of claim 18 wherein the dock modulator circuit comprises:
  a resistor capacitor network connected to receive the increment signal, to slow transmissions of the cement signal so as to adjust a time at which said increment signal is at an active voltage level,
  a first buffering circuit connected to the resistor capacitor network to generate the first increment signal from the increment signal with the slowed transitions; and
  a second buffering circuit connected to the resistor capacitor network to generate the second increment signal from the increment signal with slowed transitions.

20. The reliability testing structure of claim 17 further comprising:
  a first delaying circuit between the adder circuit and the first transmission gate to adjust liming of the transmitting of the next address code from the adder circuit to the first transmission gate;
  a second delaying circuit between the first transmission gate and the first buffer to adjust timing of the transmitting of the next address code from the first transmission gate to the first buffer;
  a third delaying circuit between the first buffer and the second transmission gate to adjust timing of the transmitting of the next address code from the first buffer to the second transmission gate; and
  a fourth delaying circuit between the second transmission gate and the second buffer to adjust timing of the transmitting of the next address code from the second transmission to the second buffer.

21. The reliability testing structure of claim 17 further comprising:
  an initial value circuit in communication with the first buffer and the second transmission gate to establish an initial value for said next address code.

22. The reliability testing structure of claim 21 wherein the initial value circuit comprises:
  a resistor having a first terminal connected to a voltage supply terminal;
  a capacitor having a first terminal connected to a second terminal of the resistor and second terminal connected to a voltage reference terminal;
  a plurality of second depletion MOS transistors of the first conductivity type, each second depletion MOS transistors of the first conductivity type having a gate connected to the connection of the first terminal of the capacitor and the second terminal of the resistor, a source connected to the voltage supply terminal and a drain connected to an output of the first buffer.

23. The reliability structure of claim 17 wherein the adder comprises:
   a first summing circuit connected to receive and add the increment signal and a least significant bit of the present address code to form a least significant bit of a next address code;
   a first carry circuit connected to receive the increment signal and the least significant bit of the present address code to determine a first carry bit from the sum of the increment signal and the least significant bit of the present address code;
   a plurality of summing circuits, each summing circuit connected to receive and add one of plurality of bits of the present address code and a carry bit determined from an adjacent less significant bit of the next address code to form one of a plurality of bits of the next address code; and
   a plurality of carry circuits, each carry circuit connected to receive one of the plurality of bit of the present address code and the carry bit determined from the adjacent less significant bit of the present address code to form one of a plurality of carry bits.

24. The reliability testing structure of claim 23 wherein the first summing circuit and the plurality of summing circuits are exclusive-OR gates.

25. The reliability testing structure of claim 24 wherein each exclusive-OR gate comprises:
   a MOS transistor of a first conductivity type having a gate connected to a first input terminal and drain connected to a second input terminal;
   a MOS transistor of a second conductivity type having a gate connected to a first input terminal and drain connected to a second input terminal;
   a first inverter circuit having an input connected to a source of the MOS transistor of the first conductivity type and an output connected to a source of the MOS transistor of the second conductivity type;
   a second inverter circuit having an input connected to the source of the MOS transistor of the second conductivity type and an output connected to the source of the MOS transistor of the first conductivity type; and
   an output terminal formed at the connection of the source of the MOS transistor of the first conductivity type, the output of the first inverter circuit, and the input of the first inverter circuit.

26. The reliability testing structure of claim 23 wherein the carry circuit is an AND circuit.

27. The reliability testing structure of claim 26 wherein the AND circuit comprises:
   a first MOS transistor the first conductivity type having a gate connected to a first input terminal, a source connected to an output terminal, and a drain connected to a voltage reference terminal;
   a second MOS transistor of the second conductivity type a gate connected to a second input terminal, a source connected to the output terminal, and a drain connected to a voltage reference terminal; and
   a first depletion MOS transistor of the second conductivity type having a gate and source connected to the output terminal and a drain connected to a voltage supply terminal.

28. The reliability testing structure of claim 13 wherein the evaluation device structures are selected from a group of evaluation device structures consisting of capacitor dielectric film evaluation devices, gate oxide integrity devices, polycrystalline silicon heating devices, contact metallurgy evaluations chains, interlayer via chains, MOS evaluation devices, plasma etching antenna effect patterns, metal electromigration structures, memory cell array, and specially designed circuit block structures.

29. The reliability testing structure of claim 13 wherein the evaluation device test structures are formed in a scribe line area between the integrated circuits on said substrate.

30. A method for forming a reliability testing structure on a substrate comprising the steps of:
   providing a substrate;
   forming a plurality of testing structures on said substrate, each testing structure being formed by the steps of:
      forming a plurality of evaluation device structures on said substrate such that multiple evaluation device structures are placed on said substrate in a stack, each device structure created to permit evaluation of failure mechanisms of said integrated circuit and,
      forming a first forcing input pad to provide a first forcing stimulus to at least one of said evaluation device structures to provide a first stimulus to stress said valuation device structure,
      forming a second forcing input pad to provide a second forcing stimulus to at least one of said evaluation device structures to provide a second stimulus to further stress said evaluation device structure,
      forming a first sensing output pad connected to sense first response from at least one of said evaluation device structures,
      forming a second sensing output pad connected to sense a second response from at least one of said evaluation device structures, and
      forming a selection circuit connected to selectively communicate the second stimulus to at least one selected evaluation device structure and the second response from the selected evaluation devices structure.

31. The method of claim 30 wherein the evaluation devices are selected from a group of evaluation devices consisting of capacitor dielectric film evaluation devices, gate oxide integrity devices, polycrystalline silicon heating devices, contact metallurgy evaluation chains, interlayer via chains, MOS evaluation devices, plasma etching antenna effect patterns, metal electromigration structures, memory cell array, and specially designed circuit block structures.

32. The method of claim 30 wherein the reliability evaluation test structure is formed in a scribe line area between integrated circuits on said substrate.

* * * * *